United States Patent [19]

Fukumoto

[11] Patent Number: 5,341,039

[45] Date of Patent: Aug. 23, 1994

[54] HIGH FREQUENCY INTEGRATED CIRCUIT DEVICE INCLUDING A CIRCUIT FOR DECREASING REFLECTED SIGNALS IN WIRING FORMED ON A SEMICONDUCTOR SUBSTRATE

[75] Inventor: Kohji Fukumoto, Hyogo, Japan

[73] Assignee: Mitsubishi Denki Kabushiki Kaisha, Tokyo, Japan

[21] Appl. No.: 858,280

[22] Filed: Mar. 26, 1992

[30] Foreign Application Priority Data

Apr. 19, 1991 [JP] Japan .................. 3-116922
Dec. 18, 1991 [JP] Japan .................. 3-334809

[51] Int. Cl.[5] .................. H03K 17/16; H03K 17/0115
[52] U.S. Cl. .................. 307/443; 307/475; 307/542
[58] Field of Search .................. 307/443, 542, 475; 333/32, 124

[56] References Cited

U.S. PATENT DOCUMENTS

| 4,675,551 | 6/1987 | Stevenson | 307/443 |
|---|---|---|---|
| 4,859,877 | 9/1989 | Cooperman | 307/443 |
| 5,029,284 | 7/1991 | Feldbaumer | 307/443 |
| 5,087,900 | 2/1992 | Birchak | 333/20 |
| 5,111,080 | 5/1992 | Mizukami | 307/475 |
| 5,134,311 | 7/1992 | Biber | 307/443 |

FOREIGN PATENT DOCUMENTS 1-169946 7/1989 Japan .

OTHER PUBLICATIONS

"A Handbook on Noise and EMI Reduction" pp. 285-295, published on Jul. 30, 1986.

*Primary Examiner*—Edward P. Westin
*Assistant Examiner*—Andrew Sanders
*Attorney, Agent, or Firm*—Lowe, Price, LeBlanc & Becker

[57] ABSTRACT

A semiconductor integrated circuit device operated under a clock signal having a high frequency exceeding 100 MHz is disclosed. In a wiring path, impedance of wiring is changed discontinuously due to a contact hole or decrease in wiring width and the like to cause mismatching. In order to make matching in such a mismatching portion, matching resistance having a value twice as large as characteristic impedance of wiring is provided. Reflection of transmitted signals at discontinuous portions of impedance can be prevented because of the matching resistance. Therefore, malfunction in a CMOS circuit of destination is prevented.

22 Claims, 8 Drawing Sheets

ALUMINUM WIRING
POLYSILICON LAYER
CONTACT HOLE

HIGH FREQUENCY INTEGRATED CIRCUIT DEVICE INCLUDING A CIRCUIT FOR DECREASING REFLECTED SIGNALS IN WIRING FORMED ON A SEMICONDUCTOR SUBSTRATE

BACKGROUND OF THE INVENTION

1. Field of the Invention

The invention relates generally to semiconductor integrated circuit devices operating at a high frequency, and more particularly, to a semiconductor integrated circuit device which can decrease reflection of transmitted signals in wiring. The invention has particular applicability to microprocessors operating at a high frequency exceeding 100 MHz.

2. Description of the Background Art

With the recent increase in degree of integration in a semiconductor integrated circuit device, requirements for operation at high speed are more and more increasing. For example, a microprocessor currently well known operates with a basic operation clock signal of 40 MHz, and it is expected that operation processing speed will be more and more increased in the future.

With the increase in operating speed of a semiconductor integrated circuit device, the presence of reflected signals generated in wiring cannot be ignored. For example, when a semiconductor integrated circuit device is operated with a basic operation clock signal exceeding 100 MHz, reflection of transmitted signals is generated in various parts in wiring. Reflection of transmitted signals is generated in areas where impedance of wiring is changed discontinuously, such as in connection portions of wiring using contact holes, portions where wiring width is decreased and the like.

Reflection of transmitted signals generated in wiring not only decreases energy of transmitted signals, but also causes malfunction in an electronic circuit of destination, because reflected signals are transmitted there. Although the present invention is applied to a semiconductor integrated circuit device operating at a high frequency exceeding 100 MHz, the following description will be made on a microprocessor as an example.

Figure 7:
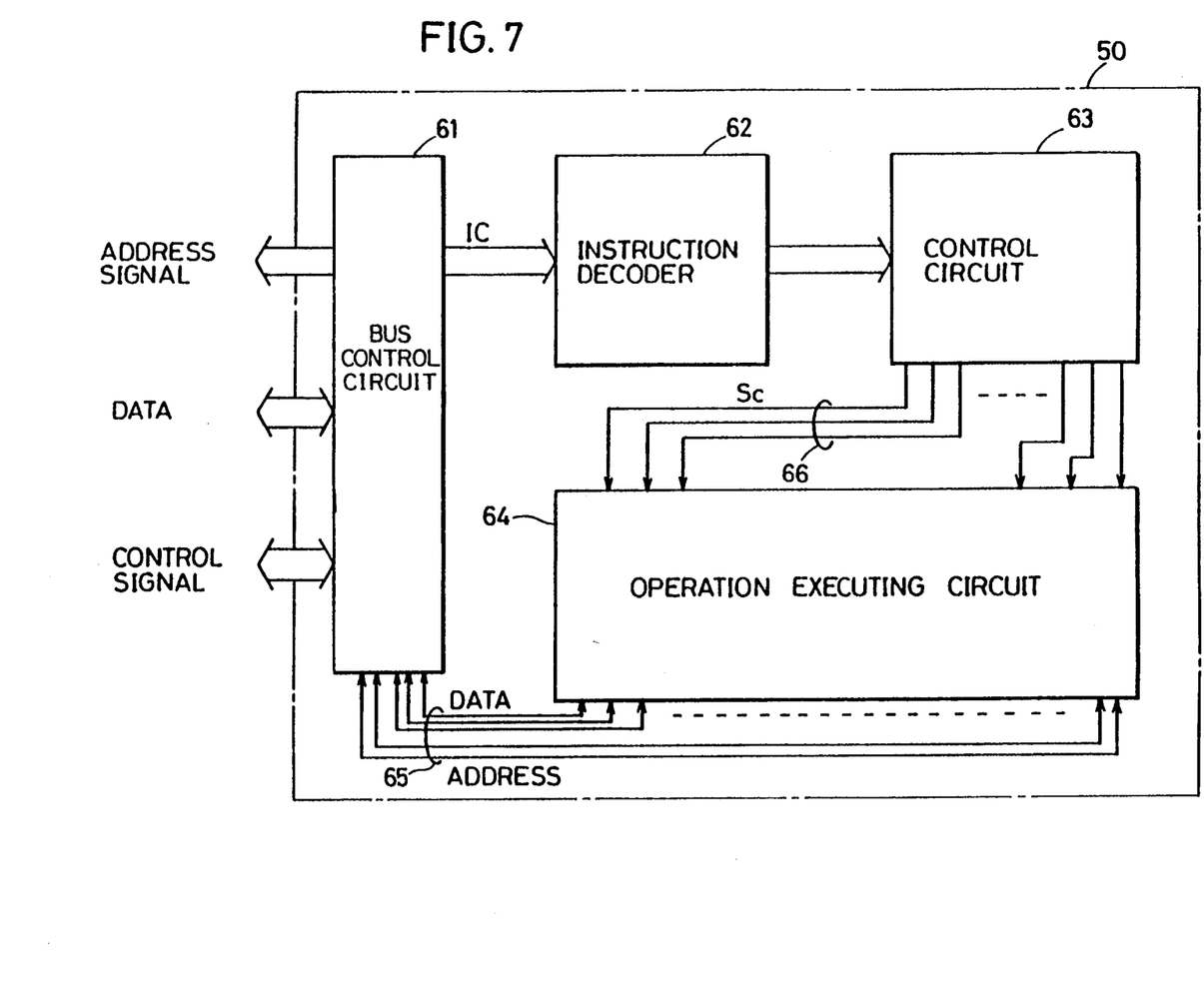
FIG. 7 is a general block diagram of a microprocessor.

FIG. 7 is a general block diagram of a microprocessor. The block diagram shows schematically a layout of a circuit configuration formed on a semiconductor substrate 50. Referring to FIG. 7, the microprocessor is provided with a bus control circuit 61 for controlling an internal data bus and an internal address bus, an instruction decoder 62 for decoding an instruction code IC, applied from bus control circuit 61, a control circuit 63 for generating various control signals Sc responsive to a decoded instruction code and an operation executing circuit 64 for carrying out operation responsive to control signal Sc. Data and address signals used in operation are applied to operation executing circuit 64 through bus control circuit 61. Data and address signals are transmitted through a wiring 65 formed on semiconductor substrate 50. On the other hand, control signal Sc is transmitted through a wiring 66 formed on substrate 50. It is pointed out that these wirings 65 and 66 have generally long wiring length.

Figure 8:
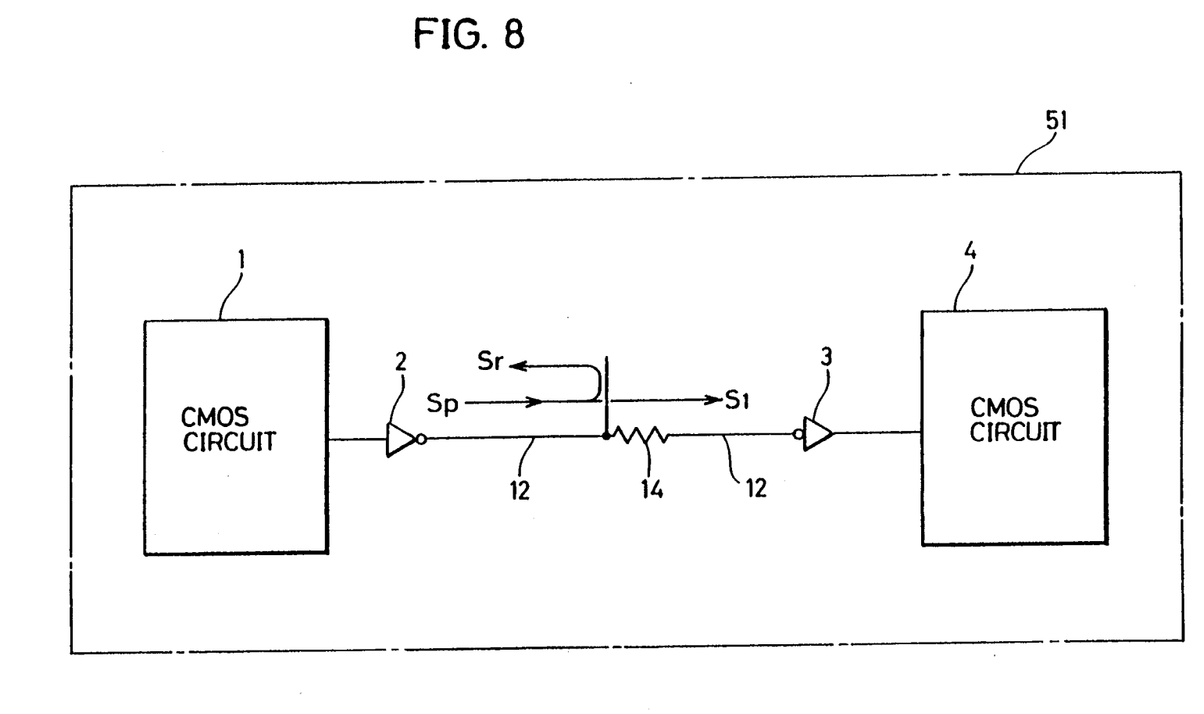
FIG. 8 is a simplified circuit diagram showing transmission of signals in a conventional semiconductor integrated circuit device.

FIG. 8 is a circuit block diagram for explaining transmission of signals in a conventional semiconductor integrated circuit device. Referring to FIG. 8, the semiconductor integrated circuit device includes two CMOS circuits 1 and 4 formed on a semiconductor substrate 51. Each of CMOS circuits 1 and 4 is configured by CMOS transistors (not shown). An inverter 2 for transmission is provided at an output of CMOS circuit 1. An inverter 3 for reception is provided at an input of CMOS circuit 4. A wiring 12 is provided between inverters 2 and 3. In the following description, it is assumed that a transmitted signal Sp output from CMOS circuit 1 is transmitted to CMOS circuit 4 through wiring 12. It is pointed out that wiring 12 shown in FIG. 8 corresponds to one of wirings 65 and 66 in a microprocessor, for example, shown in FIG. 7.

As mentioned before, wiring formed on semiconductor substrate 51 connects CMOS circuits 1 and 4 via a long wiring path on substrate 51. The long wiring path includes connection portions using contact holes and/or portions where wiring width is decreased. In such portions, impedance of wiring 12 is partially changed in general. In other words, impedance of wiring 12 is changed discontinuously. A resistance 14 shown in FIG. 8 equivalently shows resistance components generated in, for example, connection portions of wiring using contact holes. Impedance of wiring 12 is, as described before, changed discontinuously due to change in form of wiring and, therefore, such portions of discontinuous impedance are caused in a plurality of portions in a long wiring path. However, for simplification of description, only one portion is shown in FIGS. 8.

As shown in FIG. 8, although transmitted signal Sp is transmitted toward CMOS circuit 4 through wiring 12, a part of energy of transmitted signal Sp is reflected due to the presence of resistance component 14. Therefore, a reflected signal Sr reflected by resistance component 14 is superimposed on wiring 12. Other components (main components) St of transmitted signal Sp are transmitted toward CMOS circuit 4 through resistance component 14.

The reason why reflection of transmitted signal Sp is generated is described in the following. Since transmitted signal Sp is a digital clock signal of a high frequency exceeding 100 MHz, various signal components of a high frequency are included therein. It is understood that wiring 12 has characteristic impedance in signal transmission at a high frequency. Therefore, the presence of resistance component 14 serves as a discontinuous point of characteristic impedance in wiring 12. In other words, the presence of resistance component 14 causes mismatching in wiring. Reflection of transmitted signal Sp is generated in such a mismatching portion in impedance.

Reflected signal Sr causes the following problems. First, since reflected signal Sr having a high frequency is also transmitted to CMOS circuit 4 of destination, it causes malfunction in CMOS circuit 4. In other words, reflected signal Sr transmitted to CMOS circuit 4 is superimposed on original signal St and serves as a noise with respect to CMOS circuit 4. As a result, malfunction is caused in CMOS circuit 4.

In addition, since transmitted signal Sp is a clock signal, i.e., a pulse signal, having a high frequency, it includes various high frequency components. More specifically, signal Sp includes wideband signal components. As described before, since signal components of a high frequency are partially lost from transmitted signal Sp by reflection, this causes a waveform of transmitted signal Sp to change. In other words, steep rise or fall of transmitted signal St is lost. It is pointed out that this also causes malfunction in CMOS circuit 4.

Generally speaking, since clock signals or pulse signals processed in a digital circuit are wideband signals, points of discontinuous (or mismatching) impedance are ubiquitous in a circuit. This means that reflection may be generated everywhere in a circuit. As a result, malfunction is easily caused by reflection in a high speed digital circuit.

SUMMARY OF THE INVENTION

One object of the invention is to prevent malfunction caused by reflection of transmitted signals in a semiconductor integrated circuit device operated under a high frequency.

Another object is to prevent malfunction caused by reflection of transmitted clock signals in a microprocessor operated under a clock frequency exceeding 100 MHz.

In brief, a semiconductor integrated circuit device according to the present invention includes a semiconductor substrate, a first electronic circuit and a second electronic circuit formed on the substrate and transmission wiring for transmitting high frequency transmitted signals output from the first electronic circuit to the second electronic circuit. Impedance of transmission wiring is changed discontinuously due to change in form of transmission wiring at at least one position on wiring. The semiconductor integrated circuit device further includes a reflection decreasing circuit decreasing reflection generated at said at least one position on transmission wiring based on characteristic impedance of transmission wiring.

In operation, although energy of transmitted signals is partially reflected at said at least one position on wiring, the reflection decreasing circuit decreases reflection at said at least one position based on characteristic impedance of wiring. As a result, this prevents malfunction from being caused by reflection.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
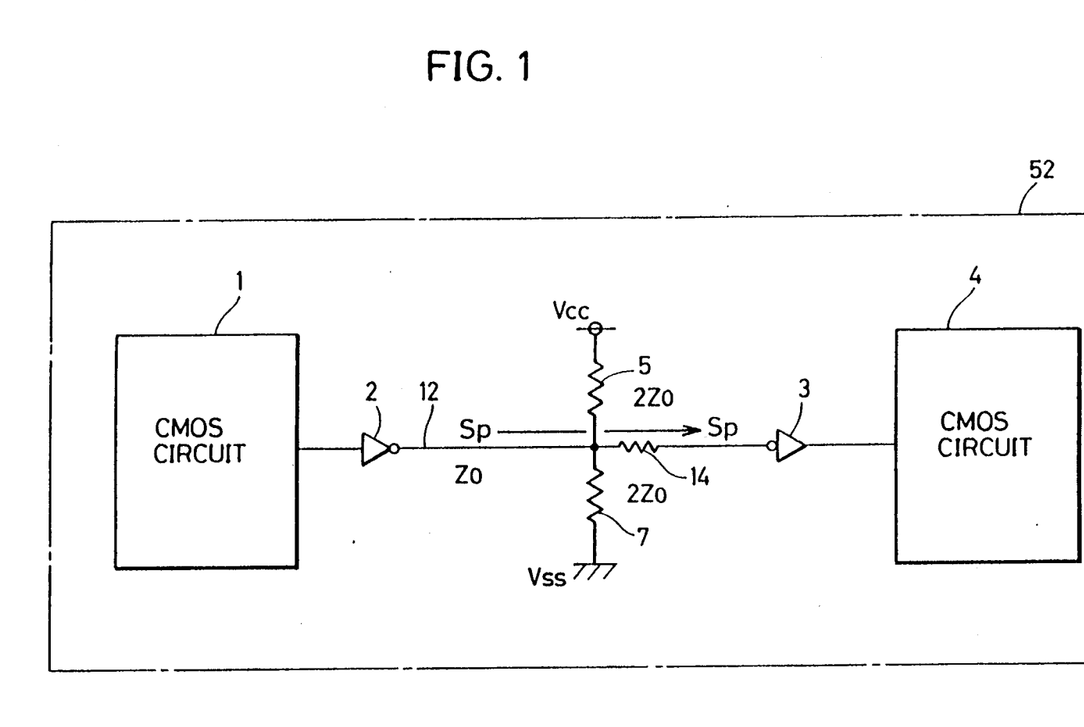
FIG. 1 is a simplified circuit diagram of a semiconductor integrated circuit device showing one embodiment of the present invention.

FIG. 1 is a simplified block diagram of a semiconductor integrated circuit device showing one embodiment of the present invention. The circuit shown in FIG. 1 can be applied to signal transmission wiring in a microprocessor, for example, shown in FIG. 7. Referring to FIG. 1, the semiconductor integrated circuit device includes CMOS circuits 1 and 4 provided on a semiconductor substrate 52. Compared with a conventional circuit shown in FIG. 8, it is pointed out that a reflection decreasing circuit including resistances 5 and 7 for decreasing or preventing reflection is provided prior to resistance component 14. In other words, resistance 5 is connected between wiring 12 and source potential Vcc in the vicinity of resistance component 14. On the other hand, resistance 7 is connected between wiring 12 and ground potential Vss in the vicinity of resistance component 14. It is pointed out that resistances 5 and 7 are, in a sense, terminating resistances.

Assuming that characteristic impedance of transmission wiring 12 is Zo, impedance or a resistance value of each of resistances 5 and 7 at a high frequency is set to 2 Zo. For example, assuming that characteristic impedance Zo of transmission wiring 12 at a high frequency is 100 Ω, resistances 5 and 7 having impedance (or a resistance value) of 200 Ω at the same frequency are provided. In general, characteristic impedance Zo of wiring can be found by calculation or simulation based on width, thickness, a dielectric constant, sheet resistivity and the like of wiring on a semiconductor substrate.

Resistances 5 and 7 serve so as to eliminate mismatching in impedance caused by the presence of resistance component 14. More specifically, since matching in impedance can be obtained because of function of resistances 5 and 7 at a position before resistance component 14 on wiring 12, reflection of transmitted signal Sp can be decreased or prevented at the portion. As a result, transmitted signal Sp is transmitted to CMOS circuit 4 without being reflected by the presence of resistance component 14.

Therefore, since signals transmitted to CMOS circuit 4 do not include reflected signal components having a high frequency, malfunction in CMOS circuit 4 is prevented. In addition, preferred waveforms of transmitted signals, i.e., transmitted clock signals or pulse signals can be obtained in CMOS circuit 4 and it also prevents malfunction.

In the above, although an example where a value (=2 Zo) twice as large as characteristic impedance Zo is chosen as a resistance value of resistances 5 and 7 was described, it is pointed out that the effect of preventing reflection can be actually obtained even though the resistance value of resistances 5 and 7 exceeds a value ten times as large as characteristic impedance Zo. In other words, it is pointed out that it is preferable to select a resistance value of resistances 5 and 7 by also taking into consideration power consumption and/or decrease in amplitude of transmitted signals.

Figures 2A, 2B:
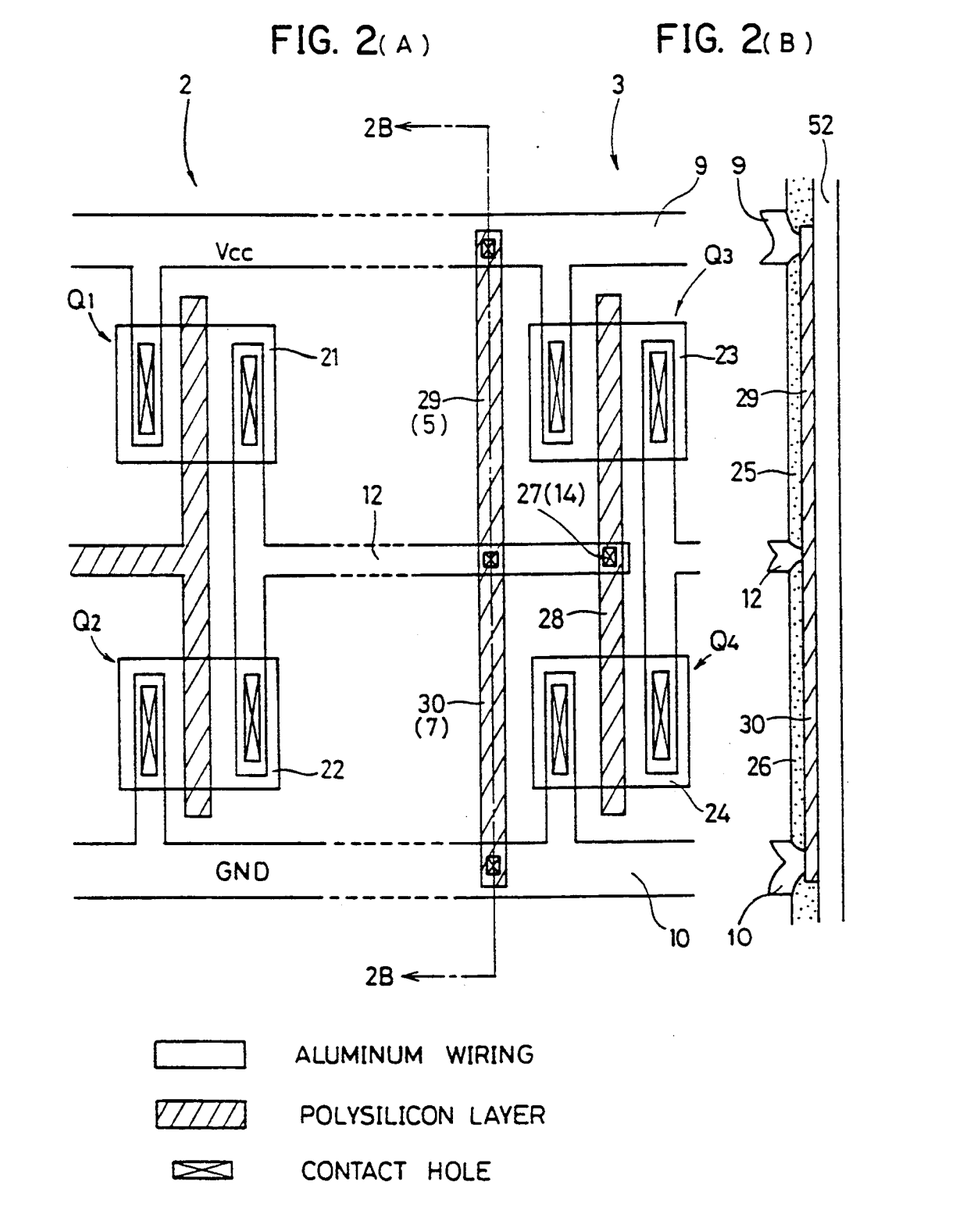
FIG. 2 is a structure diagram on a semiconductor substrate of a reflection decreasing circuit shown in FIG. 1.

FIG. 2 is a structure diagram on a semiconductor substrate of a reflection decreasing circuit shown in FIG. 1. Referring to FIG. 2(A), a CMOS inverter 2 includes a PMOS transistor Q1 formed within an n well 21 and an NMOS transistor Q2 formed within a p well 22. On the other hand, a CMOS inverter 3 includes a PMOS transistor Q3 formed within an n well 23 and an NMOS transistor Q4 formed within a p well 24. An aluminum wiring 13 connects between an output of inverter 2 and an input of inverter 3. Aluminum wiring 12 is connected to a polysilicon layer 28 constituting gates of transistors Q3 and Q4 through a contact hole 27. Therefore, resistance component 14 is present at the position of contact hole 27.

Therefore, resistances 5 and 7 for decreasing reflection are formed of polysilicon layers 29 and 30 at a position before contact hole 27. In other words, resistance 5 is formed of polysilicon layer 29 between an aluminum wiring 9 for source Vcc and polysilicon wiring 12. On the other hand, resistance 7 is formed of polysilicon layer 30 between an aluminum wiring 10 for ground and polysilicon wiring 12.

FIG. 2(B) shows a sectional configuration taken along line 2B—2B in FIG. 2(A). As shown in FIG. 2(B), polysilicon layers 29 and 30 are formed between a semiconductor substrate 52 and insulating films 25 and 26.

In an example shown in FIG. 2, although the case where resistance component 14 is generated due to the presence of contact hole 27 is shown, it is pointed out that resistance component 14, as described above, may be generated not only due to a contact hole or a through hole but also due to change in form of wiring (for example, decrease in wiring width). In addition, although, in FIG. 2, the case where resistances 5 and 7 are formed of polysilicon layers 29 and 30, resistances 5 and 7 may be implemented by MOS transistors. The following description will be made on another embodiment of the present invention.

Figure 3:
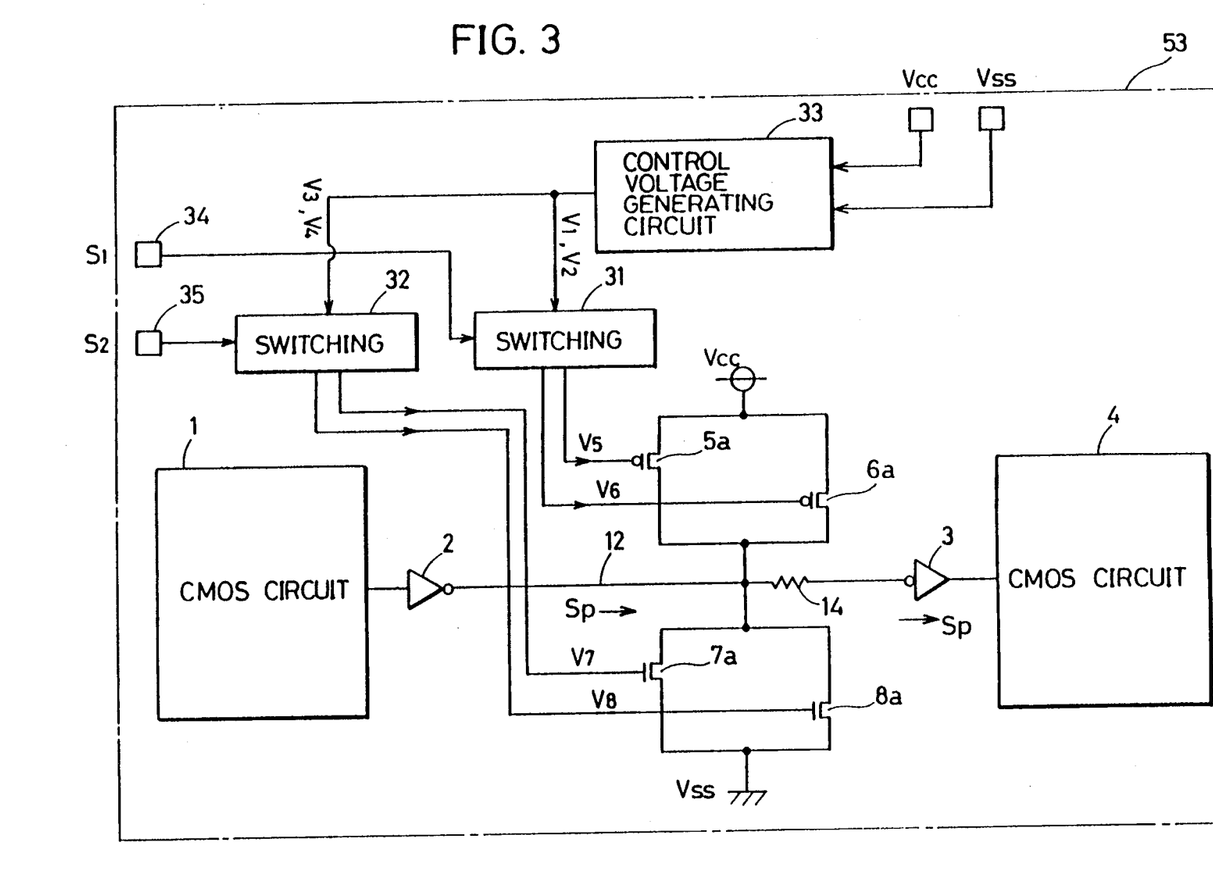
FIG. 3 is a simplified circuit diagram of a semiconductor integrated circuit device showing another embodiment of the present invention.

FIG. 3 is a simplified circuit diagram of a semiconductor integrated circuit device showing another embodiment of the present invention. Referring to FIG. 3, the semiconductor integrated circuit device is formed on a semiconductor substrate 53 and includes CMOS circuits 1 and 4, switching circuits 31 and 32 operating responsive to externally applied control signals S1 and S2 and a control voltage generating circuit 33. Transmitted signal Sp output from CMOS circuit 1 is transmitted to CMOS circuit 4 through wiring 12.

Control voltage generating circuit 33 receives source potential Vcc and ground potential Vss externally and generates predetermined control voltages V1 to V4. Switching circuit 31 receives control voltages V1 and V2 and selectively outputs control voltages V1 and/or V2 responsive to externally applied control signal S1. Switching circuit 32 receives control voltages V3 and V4 and selectively outputs them responsive to control signal 52.

PMOS transistors 5a and 6a are connected in parallel between transmission wiring 12 and source potential Vcc before resistance component 14. Gates of transistors 5a and 6a receive control voltages V5 and V6 output from switching circuit 31, respectively. In addition, NMOS transistors 7a and 8a are connected in parallel between transmission wiring 12 and ground potential Vss. Gates of transistors 7a and 8a receive control voltages V7 and V8 output from switching circuit 32, respectively.

In operation, control voltage generating circuit 33 generates control voltages V1 to V4 each having a predetermined voltage level. Switching circuit 31 selectively applies control voltages V1 and V2 to gates of transistors 5a and 6a responsive to control signal S1 applied through a bonding pad 34. In other words, gate voltages of transistors 5a and 6a can be controlled externally. In general, on resistance or conduction resistance of an MOS transistor is changed depending on the gate voltage. Since the gate voltages of transistors 5a and 6a shown in FIG. 3 can be controlled externally, impedance for matching in impedance of wiring, that is, on resistance of transistors 5a and 6a is controlled to be a preferred value.

Gate voltages of NMOS transistors 7a and 8a can also be controlled externally through switching circuit 32 in a similar way. As a result, since impedance for matching, that is, on resistance of transistors 5a, 6a, 7a and 8a can be set to an optimal value based on characteristic impedance of wiring 12, reflection generated by the presence of resistance component 14 can be reduced more flexibly.

Figure 4:
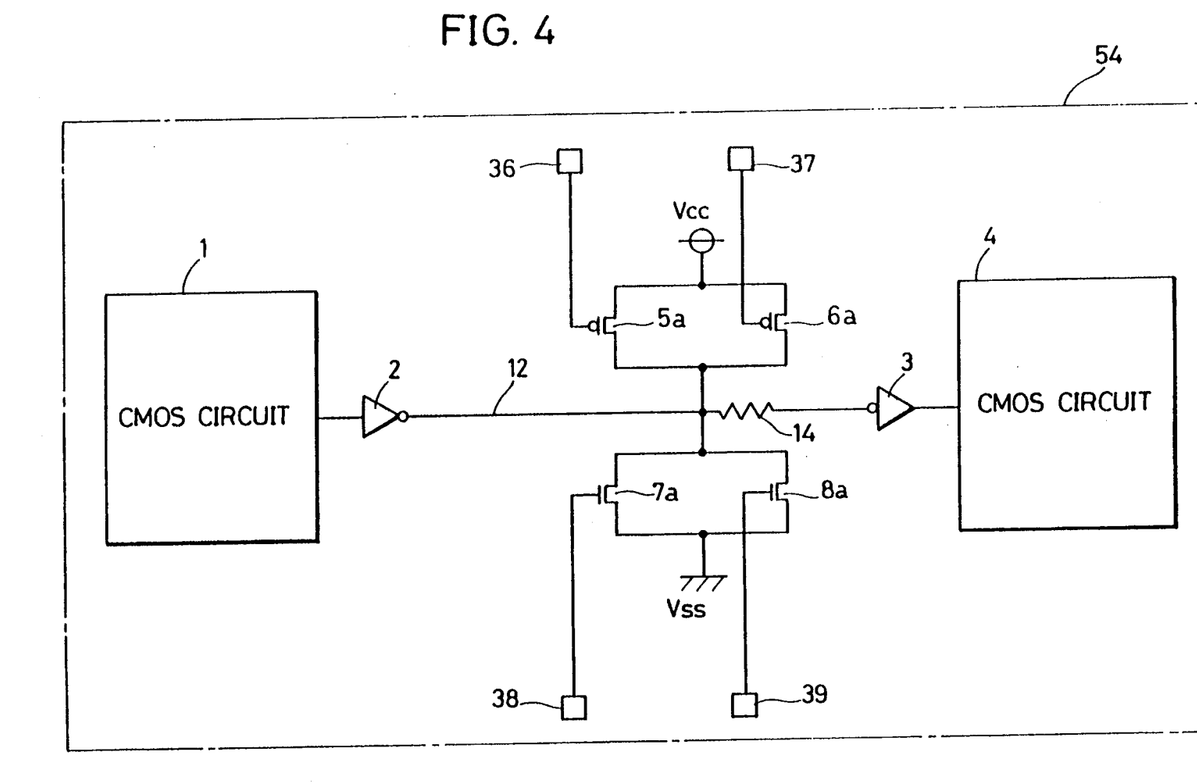
FIG. 4 is a simplified circuit diagram of a semiconductor integrated circuit device showing still another embodiment of the present invention.

FIG. 4 is a simplified circuit diagram of a semiconductor integrated circuit device showing still another embodiment of the present invention. Referring to FIG. 4, compared with the example shown in FIG. 3, it is pointed out that gate voltages of transistors 5a, 6a, 7a and 8a for matching formed on a semiconductor substrate 54 is directly controlled through bonding pad 36 or 39 externally. Therefore, switching circuits 31 and 32 and control voltage generating circuit 33 are not needed.

By controlling control voltage applied through bonding pad 36 or 39, impedance for matching, that is, on resistance of transistors 5a, 6a, 7a and 8a is adjusted to be a preferred value. Therefore, also in this embodiment, reflection generated by the presence of resistance component 14 can be prevented more flexibly.

Figure 5:
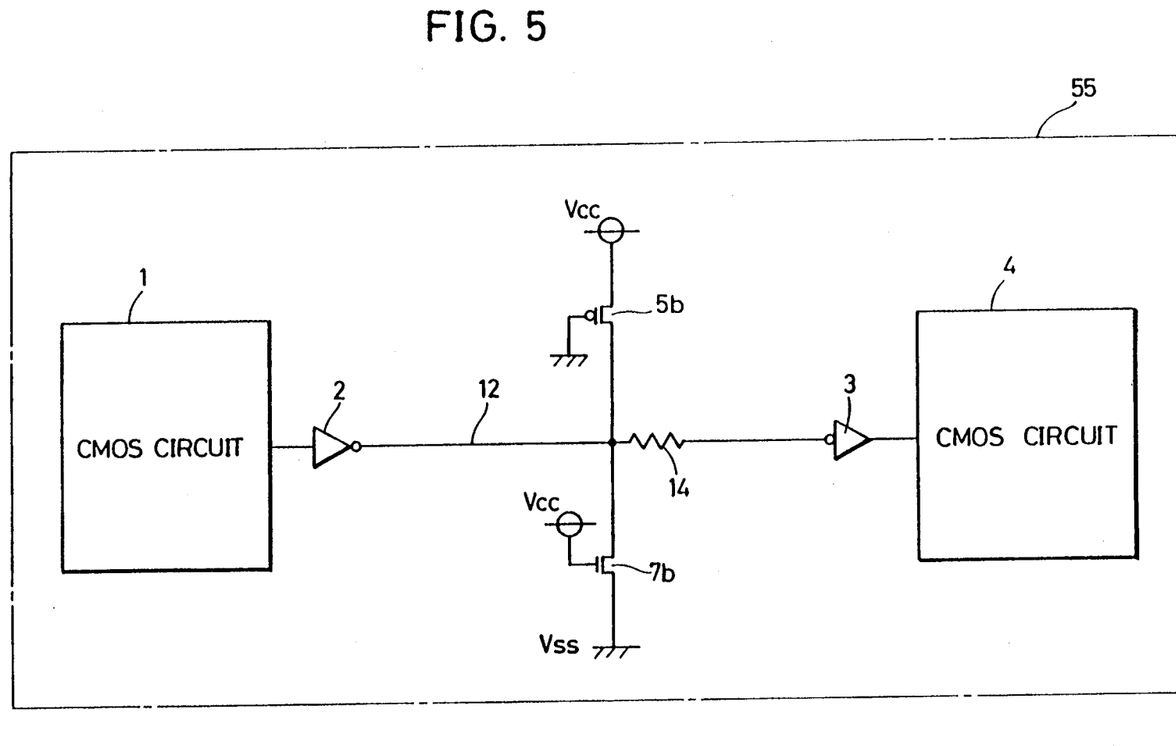
FIG. 5 is a simplified circuit diagram of a semiconductor integrated circuit device showing still another embodiment of the present invention.

FIG. 5 is a simplified circuit diagram of a semiconductor integrated circuit device showing still another embodiment of the present invention. Referring to FIG. 5, in this embodiment, a PMOS transistor 5b and an NMOS transistor 7b for matching are formed on a semiconductor substrate 55. The gate of transistor 5b is grounded. The gate of transistor 7b is connected to source potential Vcc. Therefore, transistors 5b and 7b are always brought to be in an on state. As a result, these transistors 5b and 7b serve as resistance having a resistance value determined by a predetermined on resistance. In other words, transistors 5b and 7b correspond to resistances 5 and 7 shown in FIG. 1, respectively.

Figure 6:
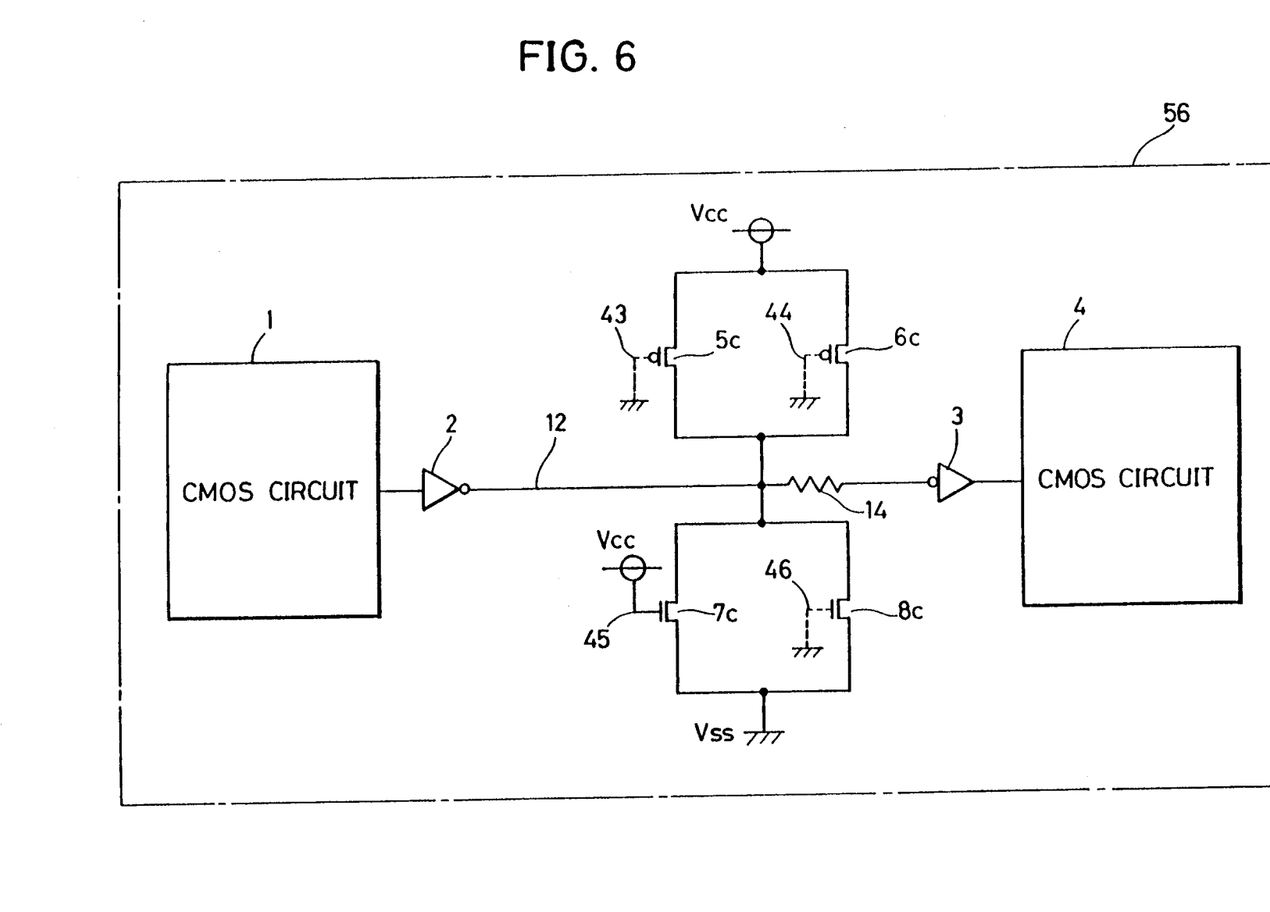
FIG. 6 is a simplified circuit diagram of a semiconductor integrated circuit device showing still another embodiment of the present invention.

FIG. 6 is a simplified circuit diagram of a semiconductor integrated circuit device showing still another embodiment of the present invention. Referring to FIG. 6, as well as the examples shown in FIG. 3 and 4, PMOS transistors 5c, 6c and NMOS transistors 7c, 8c for matching are formed on a semiconductor substrate 56. Connection between gates of transistors 5c and 6c and ground potential is made by conductor films 43 and 44 which can be formed employing FIB (Focused Ion Beam). Similarly, connection between the gate of transistor 7c and source potential Vcc is made by a conductor film 45 formed by FIB. The gate of transistor 8c is grounded through a conductor film 46 formed by FIB.

In the embodiment shown in FIG. 6, the gate of transistor for matching is selectively connected to source potential Vcc or ground potential Vss using a conductor film formed by FIB. Therefore, impedance for matching, that is, on resistance for matching can also be controlled physically. As a result, also in this embodiment, reflection generated by the presence of resistance component 14 can be more preferably prevented.

In this way, a semiconductor integrated circuit device such as a microprocessor operated at a high frequency is provided with impedance for matching of impedance in wiring, that is, resistances 5, 7, MOS transistors 5a, 6a, 7a, 8a in conduction and the like prior to resistance component 14 causing reflection. Therefore, reflection of transmitted signals at discontinuous portions of impedance in wiring 12 is prevented. In addition, in the embodiments shown in FIGS. 3, 4, 5 and 6, since impedance for matching, that is, on resistance of an MOS transistor can be controlled electrically and physically, reflection can be prevented more flexibly.

Although measures at one discontinuous portion of impedance in one wiring 12 were described in the above, it is pointed out that the similar measures are taken in another portion where impedance of wiring changes discontinuously. In addition, it is pointed out that, since resistance component 14 is caused not only due to a contact hole or a through hole but also due to change in form of wiring such as decrease in wiring width, the same measures are taken in such portions.

By effective prevention of reflection in transmission wiring as described above, malfunction in an electronic circuit of destination, i.e., CMOS circuit 4 can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device operated at a frequency exceeding a predetermined high frequency, comprising:
   a semiconductor substrate;
   a first electronic circuit and a second electronic circuit provided on said substrate;
   transmission wiring formed on said substrate for transmitting a high frequency transmitted signal output from said first electronic circuit to said second electronic circuit;
   impedance of said transmission wiring being changed discontinuously due to change in form of said transmission wiring at at least one position on said wiring;
   energy of said transmitted signal being reflected partially at said at least one position on said wiring; and
   reflection decreasing means, connected between the vicinity of said at least one position of said transmission wiring and power supply potential, for decreasing reflection generated at said at least one position of said transmission wiring, wherein
   said reflection decreasing means comprises:
      controllable impedance means formed on said semiconductor substrate, and
      impedance adjustment means for adjusting impedance of said controllable impedance means and having a first electrical control means responsive to an externally applied control signal for controlling impedance of said controllable impedance means.

2. A semiconductor integrated circuit device according to claim 1, further comprising reflection control means for controlling said reflection decreasing means so that an amount of reflection decrease by said reflection decreasing means may be maximum.

3. A semiconductor integrated circuit device according to claim 2, wherein said reflection control means comprises a second electrical control means responsive to an externally applied control signal for electrically controlling said reflection decreasing means so that an amount of reflection decrease by said reflection decreasing means may be maximum.

4. A semiconductor integrated circuit device according to claim 2, wherein said reflection control means comprises circuit connection physical change means for physically changing circuit connection in said reflection decreasing means to maximize an amount of reflection decrease by said reflection decreasing means.

5. A semiconductor integrated circuit device according to claim 1, wherein said transmission wiring produces mismatching in impedance of said wiring at said at least one position on said wiring.

6. A semiconductor integrated circuit device according to claim 5, wherein said controllable impedance means comprises a first field effect transistor connected between said at least one position on said wiring and said power supply potential, wherein said externally applied control signal is an externally applied control voltage, and wherein said second electrical control means comprises gate voltage apply means for applying said externally applied control voltage to the gate of said first field effect transistor.

7. A semiconductor integrated circuit device according to claim 6, wherein said gate voltage apply means comprises:
   a bonding pad formed on said substrate for receiving said externally applied control voltage; and
   control voltage wiring formed on said substrate between said bonding pad and the gate electrode of said first field effect transistor.

8. A semiconductor integrated circuit device according to claim 5, wherein said controllable impedance means comprises a second field effect transistor connected between said at least one position on said wiring and said power supply potential;
   said second electric control means comprising:
      control voltage generating means for generating a plurality of predetermined control voltages; and
      selective gate voltage apply means responsive to said externally applied control signal for selectively applying one of said plurality of control voltages to the gate electrode of said second field effect transistor.

9. A semiconductor integrated circuit device according to claim 1, wherein said high frequency transmitted signal is a digital clock signal transmitted at a clock cycle exceeding said predetermined high frequency.

10. A semiconductor integrated circuit device according to claim 9, wherein said first and second electronic circuits comprise first and second logic circuits formed on said substrate.

11. A semiconductor integrated circuit device according to claim 5, wherein said controllable impedance means comprises matching resistor means having resistance equivalent to characteristic impedance of said transmission wiring.

12. A semiconductor integrated circuit device according to claim 11, wherein said matching resistor means comprises a polysilicon resistor connected between the vicinity of said at least one position on said transmission wiring and said power supply potential, conduction resistance of said polysilicon resistor being set to a value equivalent to characteristic impedance of said transmission wiring.

13. A semiconductor integrated circuit device according to claim 1, wherein said predetermined high frequency is 100 MHz.

14. A semiconductor integrated circuit device according to claim 1, wherein said semiconductor integrated circuit device is a microprocessor operated under a clock cycle exceeding 100 MHz.

15. A semiconductor integrated circuit device according to claim 1, wherein said change in form of said transmission wiring at said at least one position on said wiring is caused by a contact hole formed at said at least one position on said wiring.

16. A microprocessor operated under a clock signal having a frequency exceeding 100 MHz, comprising:
a semiconductor substrate;
first and second CMOS logic circuits formed on said substrate;
transmission wiring formed on said substrate for transmitting transmitted clock signals provided from said first CMOS logic circuit to said second CMOS logic circuit;
impedance of said transmission wiring being changed discontinuously due to change in form of said transmission wiring at at least one position on said wiring;
said transmission wiring causing mismatch in impedance of said wiring at said at least one position on said wiring; and
matching means connected between the vicinity of said at least one position on said transmission wiring and power supply potential for matching impedance of said wiring at said at least one position, wherein
said matching means comprises:
controllable impedance means formed on said semiconductor substrate, and
impedance adjustment means for adjusting impedance of said controllable impedance means and having a first electrical control means responsive to an externally applied control signal for controlling impedance of said controllable impedance means.

17. A semiconductor integrated circuit device operated at a frequency exceeding a predetermined high frequency, comprising:
a semiconductor substrate;
a first electronic circuit and a second electronic circuit provided on said substrate;
transmission wiring formed on said substrate for transmitting a high frequency transmitted signal output from said first electronic circuit to said second electronic circuit;
impedance of said transmission wiring being changed discontinuously due to change in form of said transmission wiring at least one position on said wiring;
energy of said transmitted signal being reflected partially at said at least one position on said wiring; and
a field effect transistor in conduction connected between the vicinity of said at least one position of said transmission wiring and power supply potential and having a conduction resistance equivalent to characteristic impedance of said transmission line for decreasing reflection generated at said at least one position of said transmission wiring in response to an external signal.

18. A semiconductor integrated circuit device operated at a frequency exceeding a predetermined high frequency, comprising:
a semiconductor substrate;
a first electronic circuit and a second electronic circuit provided on said substrate;
transmission wiring formed on said substrate for transmitting a high frequency transmitted signal output from said first electronic circuit to said second electronic circuit;
impedance of said transmission wiring being changed discontinuously due to change in form of said transmission wiring at least one position on said wiring;
energy of said transmitted signal being reflected partially at said at least one position on said wiring; and
reflection decreasing means connected between the vicinity of said at least one position of said transmission wiring and power supply potential for decreasing reflection generated at said at least one position of said transmission wiring, wherein
said reflection decreasing means comprises:
controllable impedance means formed on said semiconductor substrate, said controllable impedance means being a field effect transistor connected between said at least one position on said wiring and said power supply potential, and
impedance adjustment means for adjusting impedance of said controllable impedance means, wherein said impedance adjustment means comprises circuit connection physical change means for selectively changing physical circuit connection within said controllable impedance means to control impedance of said controllable impedance means.

19. A microprocessor operated under a clock signal having a frequency exceeding 100 MHz, comprising:
a semiconductor substrate;
first and second CMOS logic circuits formed on said substrate;
transmission wiring formed on said substrate for transmitting transmitted clock signals provided from said first CMOS logic circuit to said second CMOS logic circuit,
impedance of said transmission wiring being changed discontinuously due to change in form of said transmission wiring at least one position on said wiring;
said transmission wiring causing mismatch in impedance of said wiring at said at least one position on said wiring; and
a field effect transistor in conduction connected between the vicinity of said at least one position of said transmission wiring and power supply potential and having a conduction resistance equivalent to characteristic impedance of said transmission line for matching impedance of said wiring at said at least one position in response to an external signal.

20. A microprocessor operated under a clock signal having a frequency exceeding 100 MHz, comprising:
a semiconductor substrate;
first and second CMOS logic circuits formed on said substrate;
transmission wiring formed on said substrate for transmitting transmitted clock signals provided from said first CMOS logic circuit to said second CMOS logic circuit,
impedance of said transmission wiring being changed discontinuously due to change in form of said transmission wiring at least one position on said wiring;

said transmission wiring causing mismatch in impedance of said wiring at said at least one position on said wiring; and matching means connected between the vicinity of said at least one position on said transmission wiring and power supply potential for matching impedance of said wiring at said at least one position, wherein said matching means comprises:

controllable impedance means formed on said semiconductor substrate, said controllable impedance means being a field effect transistor connected between said at least one position on said wiring and said power supply potential, and impedance adjustment means for adjusting impedance of said controllable impedance means, wherein said impedance adjustment means comprises circuit connection physical change means for selectively changing physical circuit connection within said controllable impedance means to control impedance of said controllable impedance means.

21. A semiconductor integrated circuit device according to claim 20, wherein said circuit connection physical change means comprises conductor means selectively formed by focused ion beam between the gate electrode of said field effect transistor and said power supply potential.

22. A semiconductor integrated circuit device according to claim 18, wherein said circuit connection physical change means comprises conductor means selectively formed by focused ion beam between the gate electrode of said field effect transistor and said power supply potential.

* * * * *